(12) United States Patent
Hort et al.

(10) Patent No.: US 7,691,240 B2
(45) Date of Patent: Apr. 6, 2010

(54) TARGET ASSEMBLIES, TARGETS, BACKING PLATES, AND METHODS OF TARGET COOLING

(75) Inventors: Werner H. Hort, Cranberry, PA (US); Scott R. Sayles, Mead, WA (US); Vince Speziale, Mead, WA (US); Stephane Ferrasse, Veradale, WA (US); Harold A. Detlaff, Chattaroy, WA (US); Stuart D. Wright, Hayden Lake, ID (US); Frank Alford, Spokane Valley, WA (US); Andrew N. A. Wragg, Timperley (GB)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/415,930

(22) Filed: May 1, 2006

(65) Prior Publication Data

US 2006/0260936 A1 Nov. 23, 2006

Related U.S. Application Data

(60) Provisional application No. 60/677,198, filed on May 2, 2005.

(51) Int. Cl.
    *C23C 14/34* (2006.01)
(52) U.S. Cl. .............................. 204/192.1; 204/192.12; 204/298.09; 204/298.12
(58) Field of Classification Search .............. 204/192.1, 204/192.12, 298.09, 298.12, 298.13
    See application file for complete search history.

(56) References Cited

U.S. PATENT DOCUMENTS

| | | | | |
|---|---|---|---|---|
| 3,838,031 A | * | 9/1974 | Snaper ..................... | 204/192.2 |
| 4,747,927 A | * | 5/1988 | Rille et al. ............. | 204/298.12 |
| 5,262,030 A | * | 11/1993 | Potter ...................... | 204/298.2 |
| 5,269,894 A | * | 12/1993 | Kerschbaumer ........ | 204/192.12 |
| 5,409,590 A | | 4/1995 | Hurwitt et al. | |
| 5,433,835 A | | 7/1995 | Demaray et al. | |
| 5,487,822 A | | 1/1996 | Demaray et al. | |
| 5,565,071 A | | 10/1996 | Demaray et al. | |

(Continued)

FOREIGN PATENT DOCUMENTS

DE 10018858 B4 10/2001

(Continued)

*Primary Examiner*—Rodney G McDonald
(74) *Attorney, Agent, or Firm*—Sandra P. Thompson; Buchalter Nemer

(57) ABSTRACT

The invention includes backing plates having coolant deflectors with at least a portion of each of the deflectors being nonlinear. Projections projecting from the backing plate are configured to insert into openings within a sputtering target. The invention includes targets having at least one opening to receive a fastener extending into the target through a back surface. The invention includes a target assembly having projections projecting from the backing plate and insertable within openings within the target. The invention includes a target assembly having a plurality of coolant deflectors disposed between the target and the backing plate. A segment of each of the deflectors is nonlinear. The invention includes methods of cooling a target. Coolant deflectors are disposed within a gap between the target and a backing plate with coolant deflectors being nonlinear along at least a portion of their length.

18 Claims, 13 Drawing Sheets
(1 of 13 Drawing Sheet(s) Filed in Color)

U.S. PATENT DOCUMENTS

| | | |
|---|---|---|
| 5,595,337 A | 1/1997 | Demaray et al. |
| 5,603,816 A | 2/1997 | Demaray et al. |
| 5,676,803 A | 10/1997 | Demaray et al. |
| 5,863,397 A | 1/1999 | Tu et al. |
| 5,985,115 A | 11/1999 | Hartsough et al. |
| 6,113,754 A | 9/2000 | Oh et al. |
| 6,340,415 B1 | 1/2002 | Raaijmakers et al. |
| 6,689,254 B1 | 2/2004 | Hurwitt |
| 6,774,009 B1 | 8/2004 | Johnson et al. |
| 6,840,427 B2 | 1/2005 | Ivanov |
| 6,878,250 B1 * | 4/2005 | Segal et al. ............ 204/298.13 |
| 6,955,852 B2 | 10/2005 | Ivanov |
| 2002/0100680 A1 | 8/2002 | Yamamoto et al. |
| 2004/0056070 A1 | 3/2004 | Ivanov |

FOREIGN PATENT DOCUMENTS

| | | |
|---|---|---|
| EP | 780487 A1 | 6/1997 |
| GB | 2178063 A | 2/1987 |
| JP | 1132761 | 5/1989 |
| WO | 9802597 A1 | 1/1998 |
| WO | WO 02/22300 * | 3/2002 |

* cited by examiner

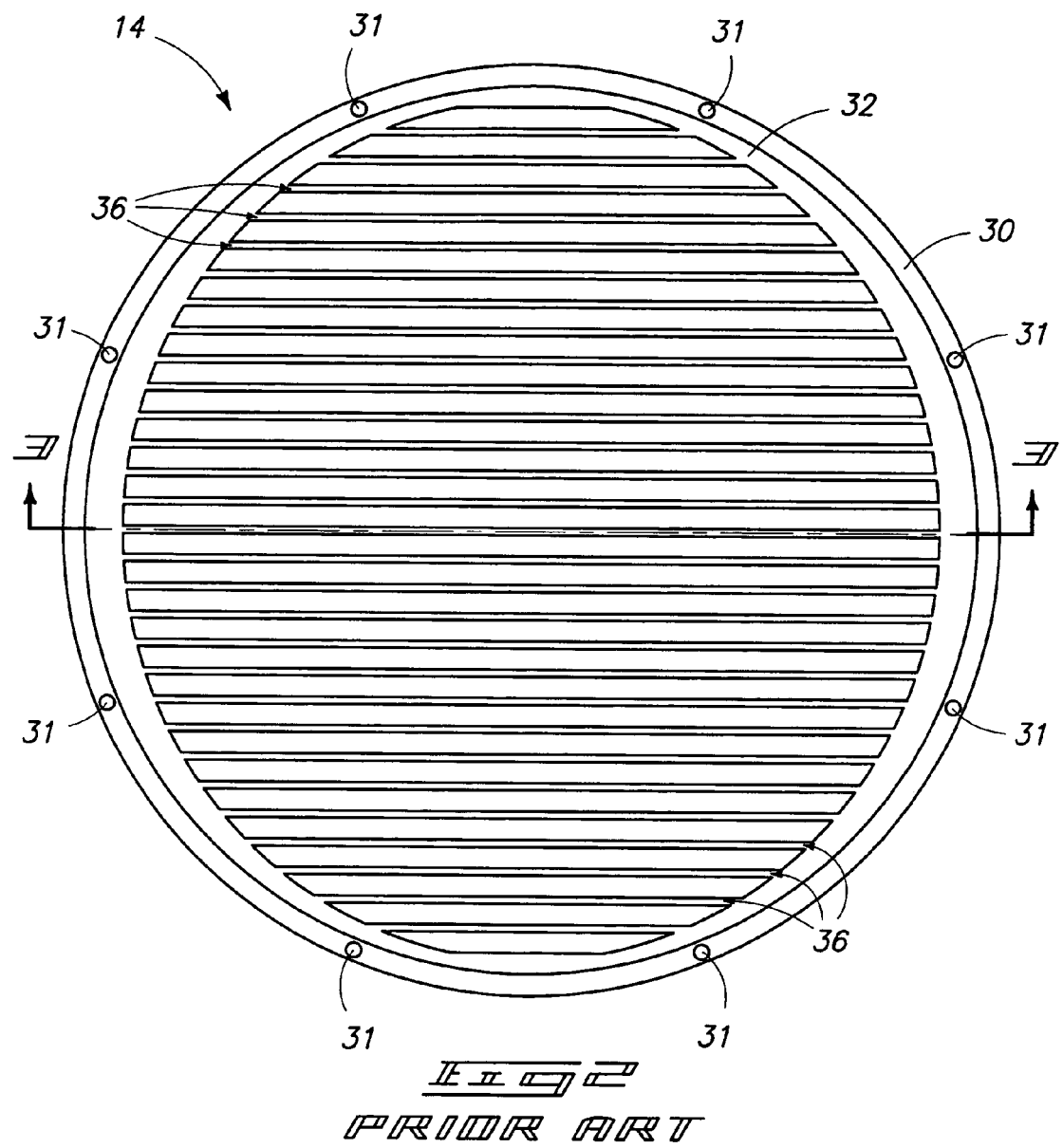
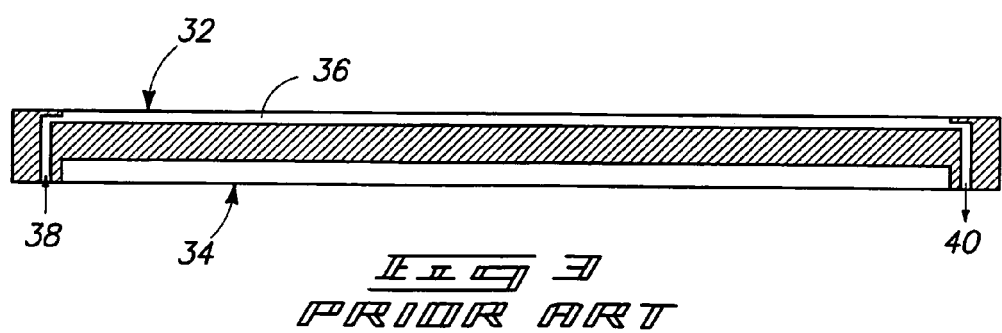

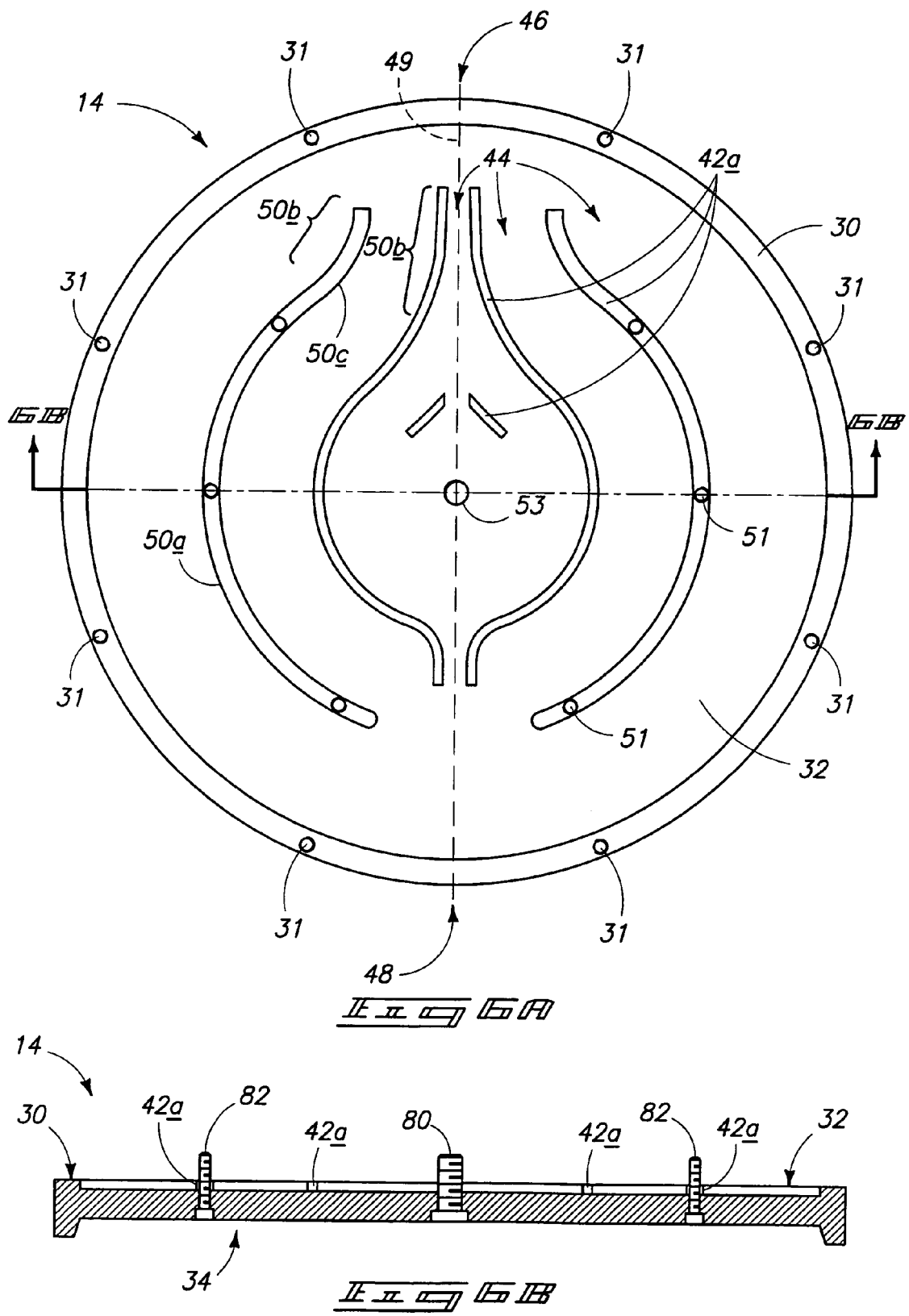

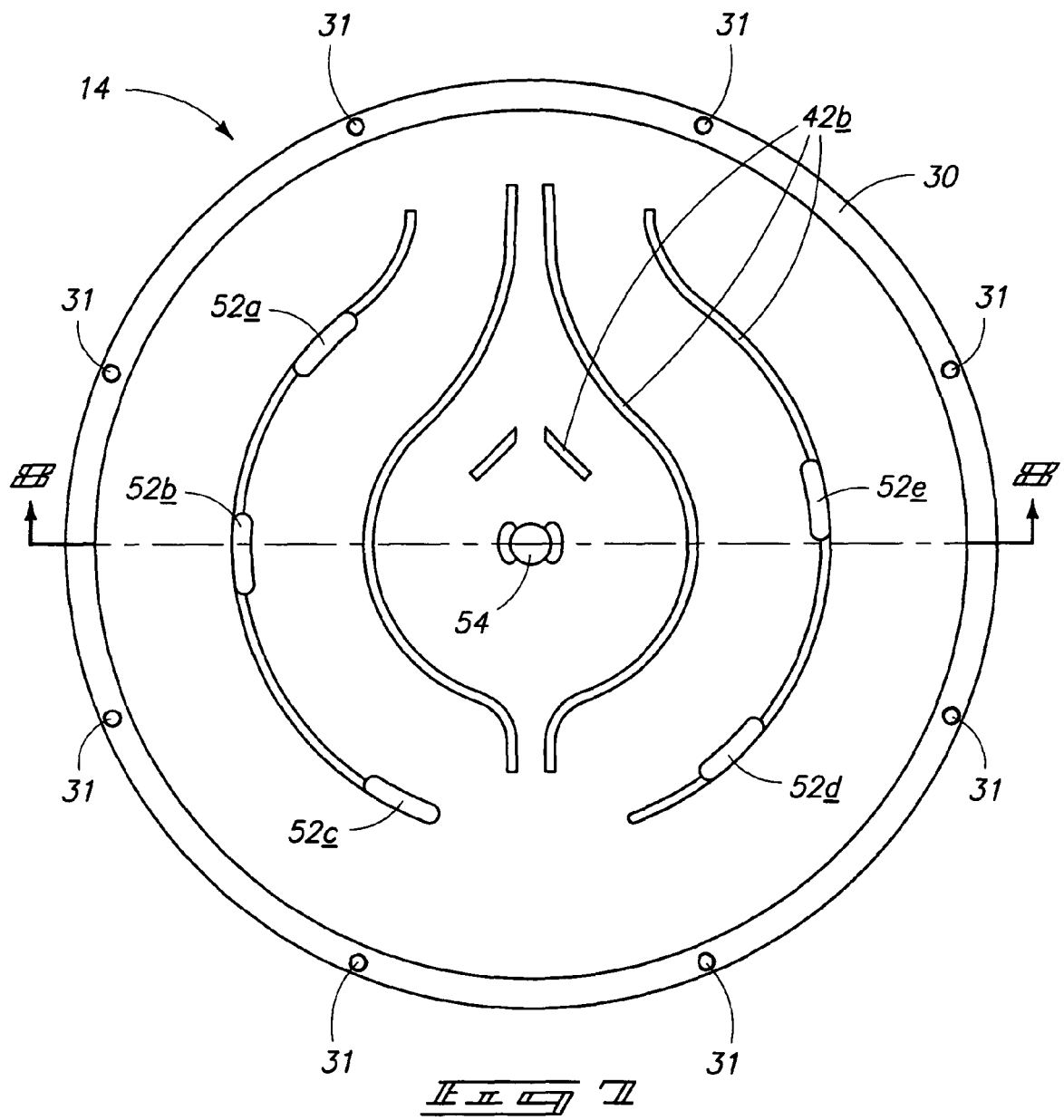
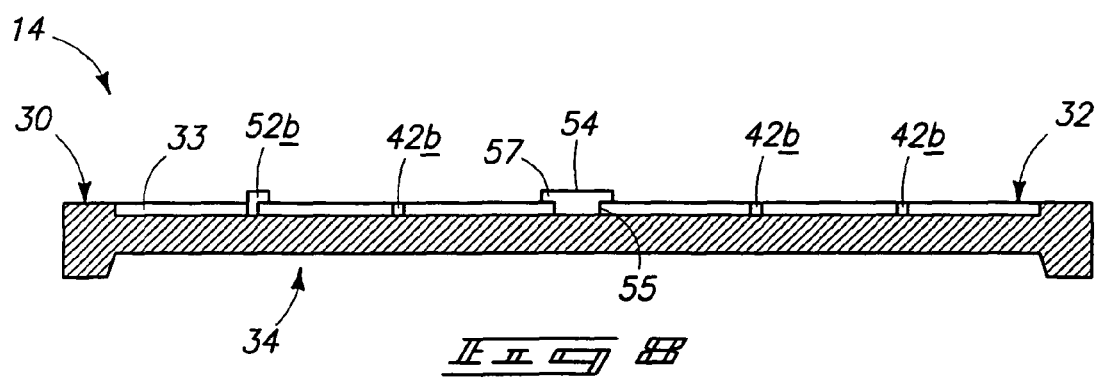

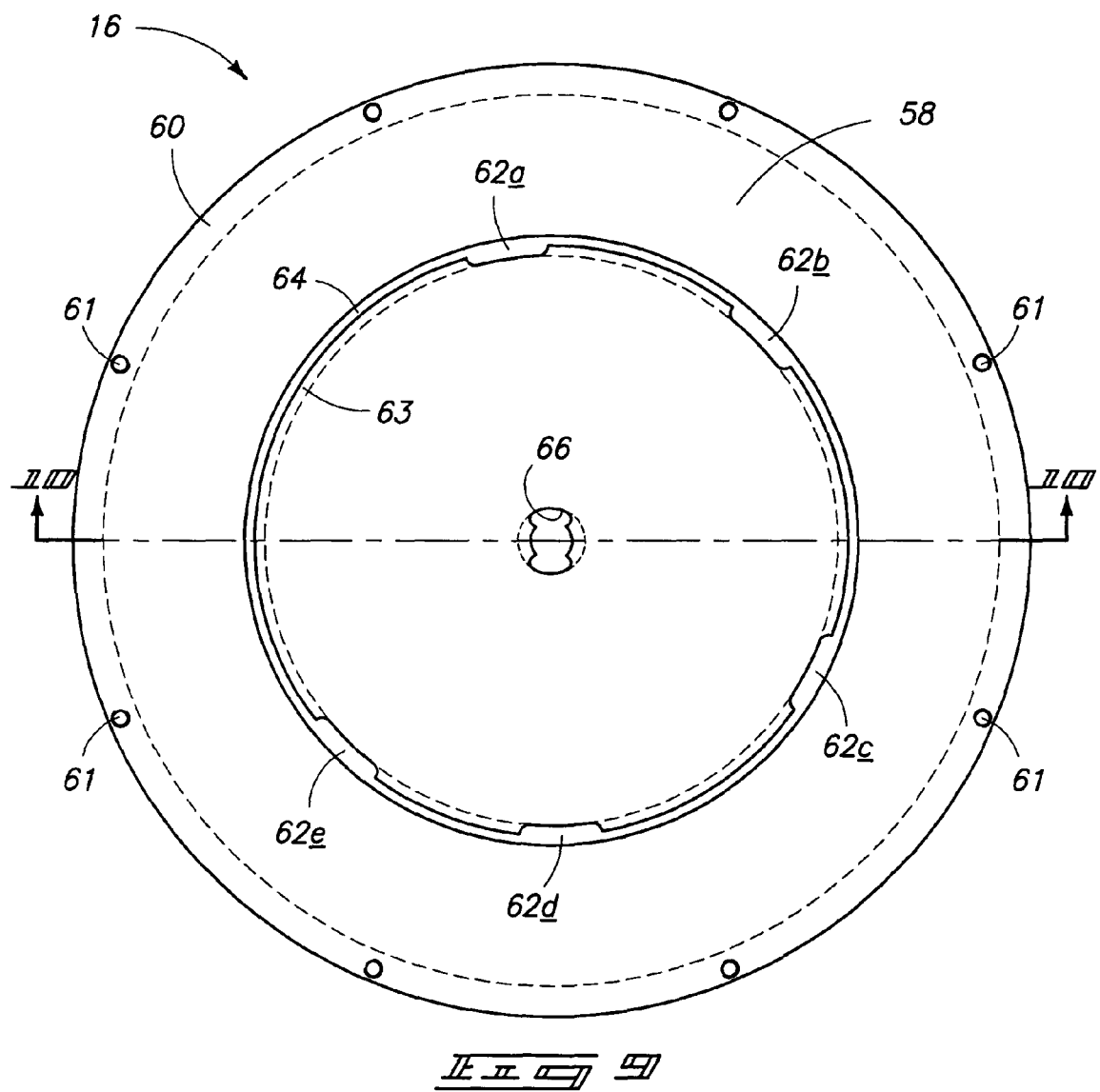
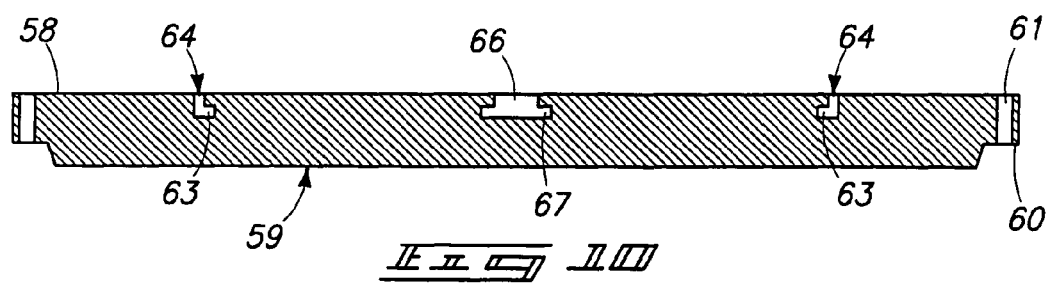

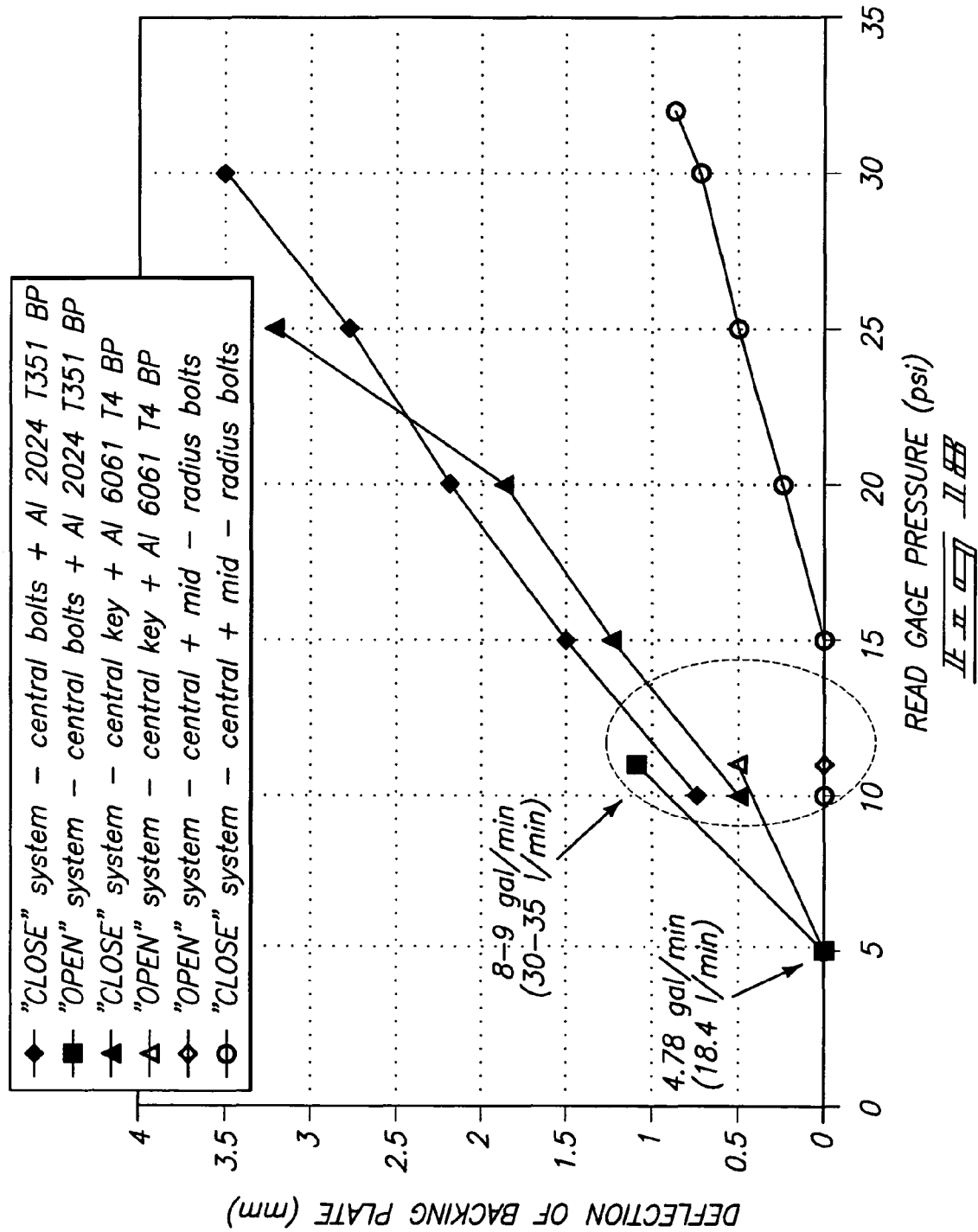

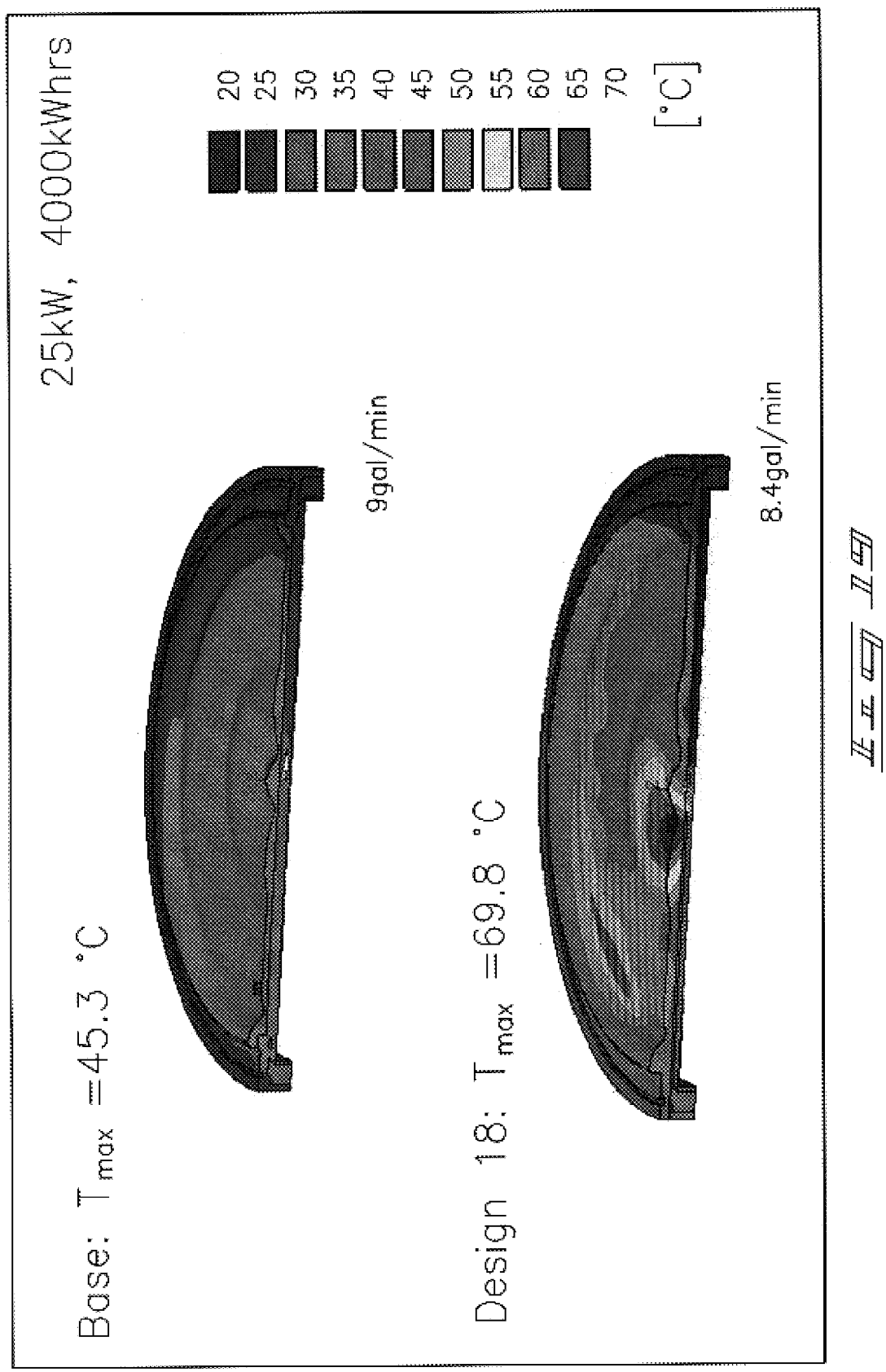

TARGET ASSEMBLIES, TARGETS, BACKING PLATES, AND METHODS OF TARGET COOLING

RELATED PATENT DATA

This patent claims benefit of priority under 35 U.S.C. §119 to U.S. Provisional Patent Ser. No. 60/677,198, which was filed May 2, 2005.

TECHNICAL FIELD

The invention pertains to target backing plates, sputtering targets, target assemblies and methods of cooling sputtering targets.

BACKGROUND OF THE INVENTION

Physical vapor deposition methods are used extensively for forming thin films of material over a variety of substrates. One area of extreme importance for such deposition technology is semiconductor fabrication. A diagrammatic view of a portion of an exemplary physical vapor deposition apparatus 10 is shown in FIG. 1. Apparatus 10 comprises a target assembly 12 which includes a backing plate 14 having a sputtering target 16 attached thereto and a cooling plate 15 attached an opposing side of the backing plate. Alternatively, some prior art assembly configurations lack the cooling plate (not shown).

Typically, apparatus 10 will include a substrate holder 18 for supporting a substrate during a deposition event. A substrate 20 such as a semiconductive material wafer is provided to be spaced from target 16. A surface 17 of target 16 can be referred to as a sputtering surface. In operation, sputtered material 24 is displaced from surface 17 of the target and deposits as a thin film onto surfaces of the sputtering chamber including the substrate, resulting in formation of a thin film 22.

Sputtering within system 10 is most commonly achieved within a vacuum chamber by, for example, DC magnetron sputtering or radio frequency (RF) sputtering. During a sputtering event, particle impingement upon surface 17 not only ablates material from such surface but additionally results in target heating. Accordingly, target cooling becomes important in order to maintain the integrity of the target and target assembly, and to maintain production of uniform and high-quality thin films.

Various materials including, metals, alloys and ceramics are deposited utilizing physical vapor deposition. Common target materials include, for example, aluminum, titanium, copper, tantalum, nickel, molybdenum, gold, silver, platinum, and alloys thereof. Sputtering targets are typically made of a high purity material. Since many high-purity materials are low strength, backing plates can be attached to the targets to provide support, especially for applications where the target is under pressure exerted by a cooling system.

Conventional backing plates are typically formed from copper, copper alloys (e.g. CuCr, CuZn), or aluminum alloys (e.g. Al6061, Al2024). These materials are typically chosen due to their thermal, electrical and/or magnetic properties. Aluminum alloys can have up to three times lower density than copper alloys but also can have a weaker Young's modulus.

In order to provide target cooling, conventional systems typically employ water cooling where water is either provided in a reservoir located behind the backing plate, between backing plate 14 and cooling plate 15, or between the backing plate and the target. However, conventional cooling systems are often of limited effectiveness and can be problematic.

In assembly configurations where the backside of the backing plate is exposed to the water, cooling efficiency can be limited due to the distance between the water and the target. In alternative conventional target configurations, cooling utilizes water channels along a backside of the target (between the target and backing plate) or by providing channels within an insert (not shown) disposed between a target and the backing plate. An exemplary conventional backing plate 14 for a channel cooled target assembly is depicted in FIG. 2.

Conventional backing plate 14 is configured to have a plurality of narrow channels or openings 36 across a front side 32 of the backing plate, where front side refers to the side of the backing which will interface a target within a target assembly. Backing plate 14 has a peripheral region 30 and is shown to comprise a plurality of bolt holes 31 which can be utilized to attach the backing plate to the target. It is to be understood that the backing plate depicted in FIG. 2 is an exemplary configuration and that alternative methods of attaching the target to the backing plate such as soldering or diffusion bonding can be utilized. However, bonding and/or soldering techniques can be problematic due to differences in thermal expansion between target and backing plates, which can result in bond failure and/or water leakage from between the cooling plate and target.

The plurality of narrow parallel channels of the conventional backing plate shown in FIG. 2 can additionally be problematic due to high pressures for producing water flow through the channels. Referring to FIG. 3, such shows a cross-sectional view of backing plate 14 and illustrates a water inlet 38 through the backside 34 of backing plate 14 in the peripheral. One of the narrow channel 36 is depicted across front surface 32 through which water passes, exiting the backing plate through an outlet 40 through the backside 34. Due to the limited water flow and high pressure during sputtering events, the backing plate configuration depicted in FIGS. 2 and 3, can result in water leakage, target damage/or and target deformation.

As an alternative to the channeled backing plate configuration, some conventional target assemblies utilize three or more components including a target attached to an insert or membrane which is connected to a backing plate. In addition to having low capacity water flow, these multi-component designs can be complicated and can result in misalignment during sputtering resulting in water leakage. Additionally, conventional methods of joining the target and backing plate can contribute to target warping and leakage problems.

It is desirable to develop alternative target assembly configurations and alternative cooling methods for sputtering deposition.

SUMMARY OF THE INVENTION

In one aspect the invention encompasses target backing plates. The backing plate has a first side configured to interface with the sputtering target and an opposing second side. A plurality of deflectors is disposed on the first side with at least a portion of each of the deflectors being nonlinear. The invention further encompasses target backing plates having a peripheral region disposed at an outer portion of the first face and a depression disposed radially inward relative to the peripheral region. A coolant deflector is present within the depression and a projection projecting from the deflector and is configured to insert into an opening within a sputtering target.

In one aspect the invention encompasses sputtering targets having a back face configured to interface with a backing plate. The back face has a surface which opposes a target sputtering surface. At least one opening extends into the target through the surface where the opening is configured to receive a fastener.

In one aspect the invention encompasses a target assembly which includes a sputtering target having a backside surface and having an opening extending from the backside surface less than an entirety through the target. The assembly additionally includes a target backing plate having a front face configured to interface with the backside of the sputtering target. A projection projects from the front face of the backing plate and is insertable within the opening of the target.

In one aspect the invention encompasses a target assembly which includes a sputtering target having a backside. The assembly additionally includes a target backing plate having a front face configured to interface with the backside of the sputtering target and having an opening extending from the front face less than an entirety through the backing plate. A projection projects from the backside of the target and is insertable within the opening of the backing plate.

In one aspect the invention encompasses a sputtering target assembly comprising a sputtering target and a backing plate and having a plurality of coolant deflectors disposed between the target and the backing plate where at least some segment of each of the deflectors is nonlinear.

In one aspect the invention encompasses methods of cooling a target. A target is provided and a backing plate is provided in association with the target. Coolant deflectors are disposed within a gap between the target and the backing plate with coolant deflectors being nonlinear along at least a portion of their length. Coolant is flowed within the gap between the target and the backing plate.

BRIEF DESCRIPTION OF THE DRAWINGS

Preferred embodiments of the invention are described below with reference to the following accompanying drawings.

The patent or application file contains at least one drawing executed in color. Copies of this patent or patent application publication with color drawing(s) will be provided by the Patent and Trademark Office upon request and payment of the necessary fee.

FIG. 2 is a diagrammatic bottom view of a portion of a prior art backing plate.

FIG. 3 is a diagrammatic cross-sectional view of a prior art backing plate taken along line 3-3 of FIG. 2.

FIG. 6A is a diagrammatic bottom view of a backing plate in accordance with one aspect of the invention.

FIG. 6B is a diagrammatic cross-sectional view of the backing plate shown in FIG. 6A taken along line 6B-6B.

FIG. 7 is a diagrammatic bottom view of a backing plate in accordance with one aspect of the invention.

FIG. 8 is a diagrammatic cross-sectional view of the backing plate shown in FIG. 7 taken along line 8-8.

FIG. 9 is a diagrammatic top view of a sputtering target in accordance with on aspect of the invention.

FIG. 10 is a diagrammatic cross-sectional view of the target depicted in FIG. 9 taken along line 10-10.

FIG. 18 shows the measured backing plate deflection as a function of pressure for assemblies in accordance with one aspect of the invention.

FIG. 19 is a target cooling profile comparison between a conventional assembly using high-pressure cooling (Top), and an assembly in accordance with the invention (Bottom).

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention includes methodology for target cooling and production of target assemblies and components thereof having improved target cooling characteristics. In general, target configurations of the invention provide increased cooling efficiency and decreased coolant leakage relative to alternative configurations. Methodology and assembly configurations in accordance with the invention are described generally with reference to FIGS. 4-14.

Figure 1:
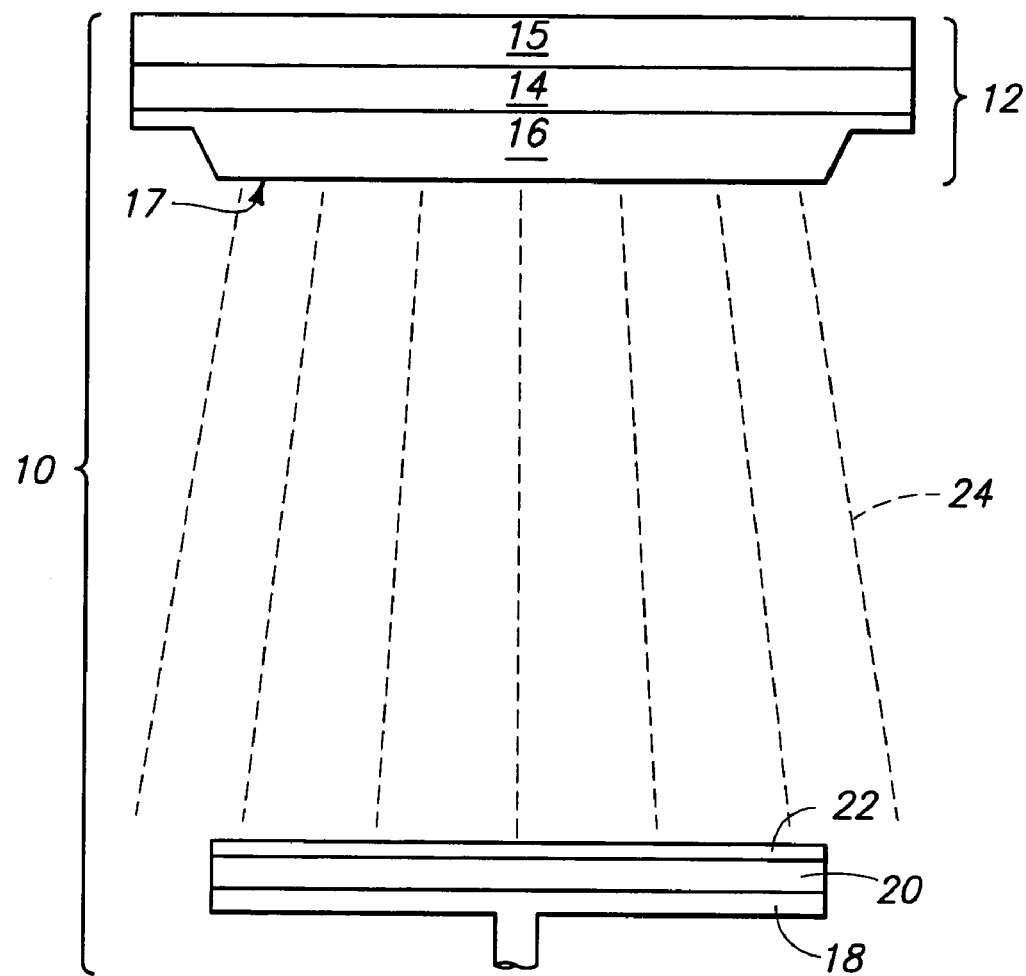
FIG. 1 is a diagrammatic view of a portion of a prior art physical vapor deposition apparatus.
Figure 4:
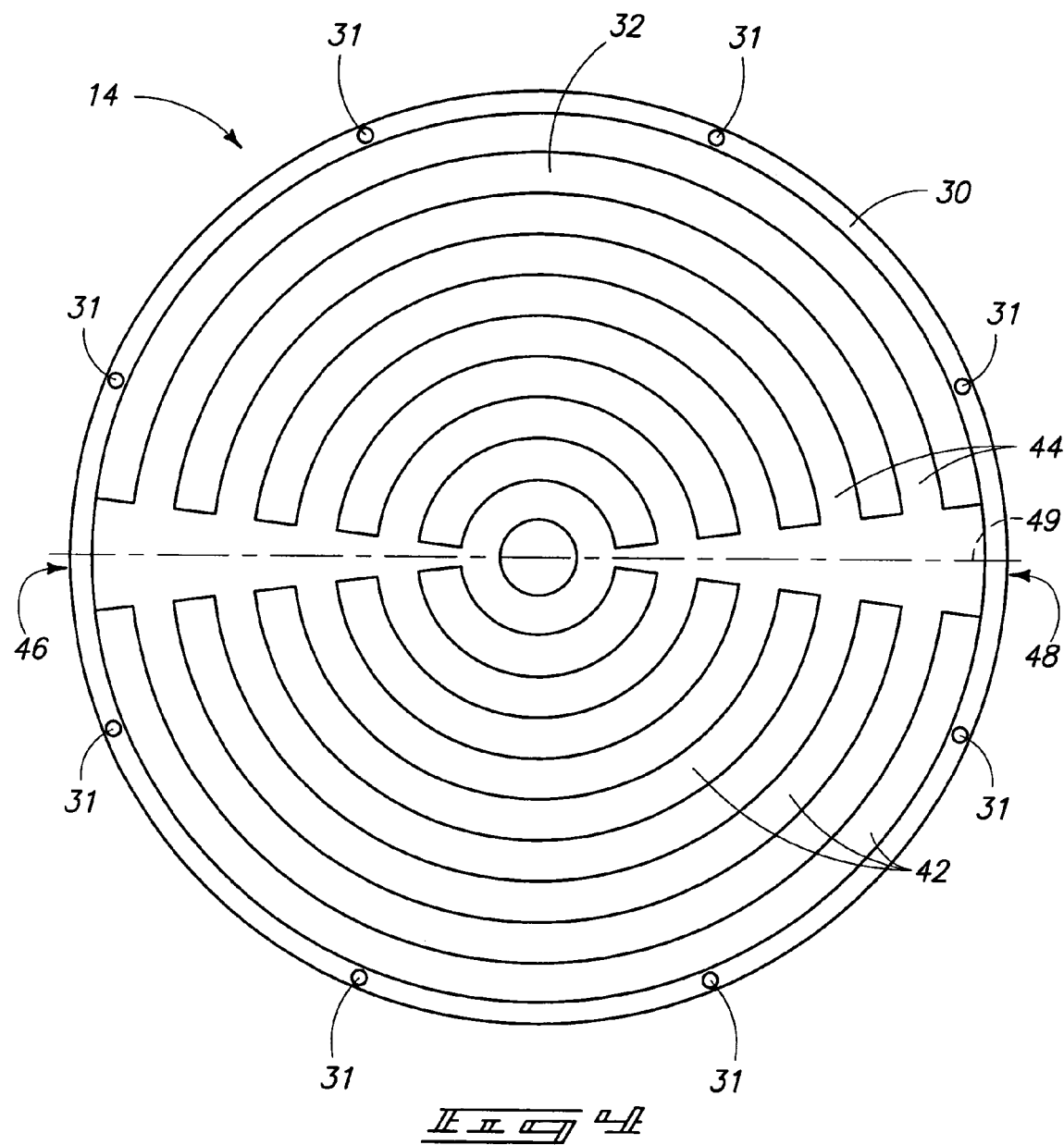
FIG. 4 is a diagrammatic bottom view of a backing plate illustrating one aspect of the invention.

Referring initially to FIG. 4, such shows a backing plate 14 having a front side 32, where front side refers to the face of the backing plate which will interface a target in a target assembly. As illustrated, backing plate 14 has a peripheral region 30 encircling the backing plate having a plurality of mounting holes 31 passing therethrough. The number of mounting holes illustrated is for exemplary purposes only and the backing plate can comprise a fewer or greater number of holes relative to that shown. Alternatively, in certain embodiments where alternative techniques are utilized for attaching backing plate 14 to a target, peripheral region 30 can have an absence of mounting holes 31.

In accordance with one aspect of the invention, backing plate 14 can have a plurality of coolant flow deflectors 42. The deflector structures are spaced relative to each other to form a plurality of inter-deflector coolant channels 44. In contrast with prior art configurations, the backing plate 14 is configured such that deflectors 42 are non-linear and/or non-parallel relative to each other along at least a portion of their length. Deflectors 42 can preferably be curved or arced along at least a portion of their length. In some instances, deflectors 42 can be curved along an entirety of their length as illustrated in FIG. 4.

The number of deflectors present on a give backing plate is not limited to a particular value and can depend upon factors such as the size of the backing plate and the thickness of the deflectors. Preferably, the number of flow deflector structures is limited to a minimum number sufficient to direct the flow of water or alternative coolant across the back of an interfacing target to where cooling is needed. By utilizing a minimum number of deflectors, the area of the target in direct contact with the cooling fluid can be maximized. This in turn allows coolant to flow at much lower pressures than conventional configurations.

Upon incorporation of backing plate 14 into a target assembly, water (or alternative coolant) can be introduced through an inlet disposed on an inlet side 46 of the backing plate. Typically, the inlet will be provided through the flange (peripheral) region on a backside of the target which opposes front side 32. The water flow is directed by the deflectors across the target and through channels 44 of backing plate 14. The deflectors can be configured such that the coolant is directed to areas of the target where heat build up is most likely, and/or to where target cooling is most needed. An outlet (not shown) is provided on an opposing outlet side 48 of the backing plate. In particular instances, the inlet and outlet will be directly laterally opposed across the backing plate, although alternative configurations are contemplated.

Although not limited to such configuration, it can be preferable in particular embodiments, that two mirror-image sets of deflectors be provided such as illustrated in FIG. 4, where a line of symmetry is present between the two sets such as represented by dashed line 49 in FIG. 4. The line of symmetry is preferably defined by an inlet and an opposing outlet. Deflectors on opposing sides of the line of symmetry can be referred to as first and second opposing sets, with each set being a mirror image of the opposing set.

Although FIG. 4 depicts each of deflectors 42 as being homogenously arced and concentric, it is to be understood that one or more deflectors or portions thereof can be non-homogenous relative to other portions.

Due to the ability to utilize decreased coolant pressure in target assemblies of the invention, assemblies can be manufactured to utilize bolts and o-rings while avoiding high pressure leak problems. This can result in a lower defect rate and allow less expensive targets. Additionally, assemblies in accordance with the invention can be manufactured from two parts (excluding attachment devices); the backing plate and the target, without utilization of an insert or other intermediate structure. Additionally, the backing plates of the invention can be reusable.

Figure 5:
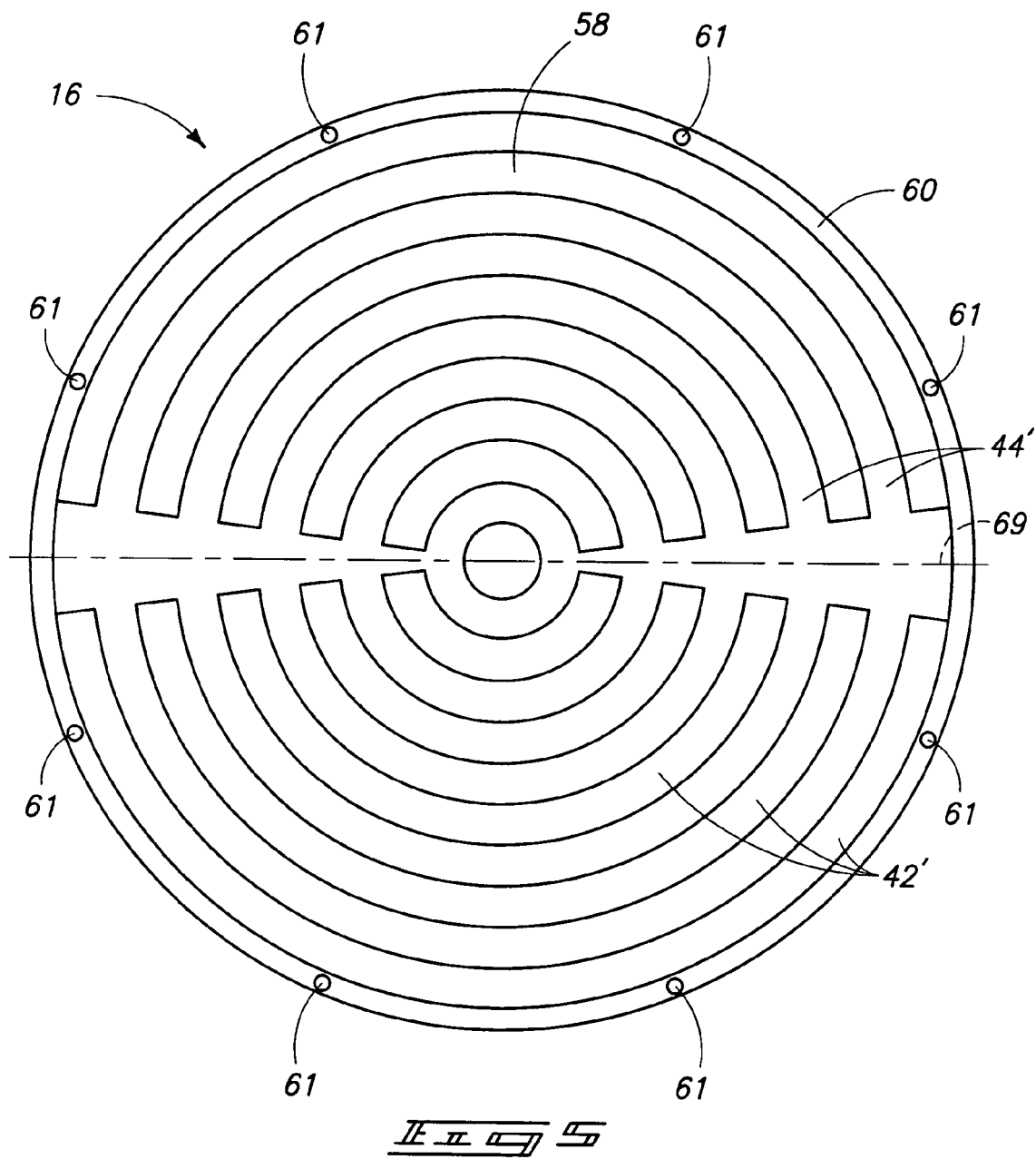
FIG. 5 is a diagrammatic top view of a target illustrating another aspect of the invention.

Although FIG. 4 depicts deflectors 42 to be integral with the backing plate, it is to be understood that the invention also contemplates assemblies having deflectors that are integral with the backside of a target, or having deflectors on each of the target and backing plate. An exemplary target 16 having coolant deflectors 42' in accordance with the invention along a backside 58 of the target is illustrated in FIG. 5. Deflectors 42' associated with the target can direct coolant through channels 44' in a manner analogous to that discussed above with respect to the backing plate depicted in FIG. 4. As shown, the target can comprise mirror image sets of deflectors across a line of symmetry 69. It is to be understood that targets in accordance with the inventions can have alternative deflector configurations relative to FIG. 5, including but not limited to the various configurations discussed below with respect to backing plates.

In an alternative configuration, deflectors can be provided independently of the target and backing plate (not shown) and can be held within a space between the target and the backing plate by clamping or alternative joining of the target and backing plate. For example, slots or grooves can be provided within a surface of the backing plate, the target or both for insertion of the deflectors. Independent deflectors can be configured to have a height slightly exceeding the height of the space between the target and backing plate such that upon insertion into the slots, the deflector can span the space between the two components. The slots can be useful for positioning and stabilizing the deflectors within the assembly. Attachment of the target to the backing plate by, for example, any of the attachment techniques discussed herein or alternative attachment methods, can additionally function to hold the deflectors in place. It can be preferable in particular applications however, to provide the deflectors as an integral part of a backing plate which can be reused thereby minimizing cost of target manufacture and cost of the overall target assembly.

The area occupied by flow modification devices/deflectors can preferably be less than 50% of an exposed area of the target (i.e. the sputtering surface). More preferably the area occupied by the deflectors is less than 10% of such sputtering area. For particular applications the area occupied by the deflectors is less than 3% of the sputtering area and in particular instances can be less than 1% of such area.

Referring next to FIG. 6A, such illustrates an exemplary alternative flow deflector configuration in accordance with the invention. Although illustrated and discussed as being disposed on a backing plate, the deflector configuration can alternatively or additionally be present on the back side of a target. As illustrated, backing plate 14 has an inlet side 46 and an outlet side 48 which define a line of symmetry between sets of deflectors 42a. In the configuration shown, each set of deflectors contains three contoured deflectors separated by channels 44. The two radially outermost deflectors in each set include an arced segment 50a and can have at least one elongated end portion 50b. A second arced segment 50c can be arced in an opposing direction relative to the arc direction of segment 50a. In the embodiment illustrated, the opposingly-arced portions 50c are comprised by elongated portions 50b, however alternative relative positions of arced segments and arc curvatures are contemplated.

Preferably, when present, elongated portions 50 are present at the end of the deflectors proximate the inlet side 46. Elongated portions can also be present at the end of the deflectors proximate outlet end 48, however, when present such elongated regions can preferably be shorter than those present proximate the inlet.

The lateral width of deflectors 42a is not limited to a particular value. Additionally, different deflectors within a given set can have differing widths relative to one another. As shown in FIG. 6A, one of the deflectors in each set can be provided to have one or more bolt openings 51 extending therethrough and further extending through backing plate 14. Such can be utilized to provide radially intermediate bolts to secure backing plate 14 to a target in a target assembly configuration in accordance with the invention. For purposes of the present description the terms "radially intermediate" or "intermediate" can refer to a feature disposed radially between the center of the backing plate or target and the peripheral region. Although not specifically depicted in FIG. 6A, additional or alternative deflectors within the set can also be of sufficient width to allow incorporation of bolt holes passing therethrough.

The invention further contemplates providing one or more bolt opening 53 passing through backing plate 14 at or near a central point on the backing plate to further secure the target and backing plate within an assembly. Referring to FIG. 6B, such illustrates a central bolt 80 passing centrally through backing plate 14. Also illustrated are radially intermediate bolts 82 extending through the backing plate and the outermost deflectors 42a. It is to be understood that where a central bolt is used, such can be referred to as a central attachment and can be used individually or in conjunction with intermediate radial attachments via openings 51 and/or peripheral bolts through peripheral openings 31.

Upon incorporating backing plate 14 into a target assembly, bolts 80 and/or 82 can pass less than an entirety through the associated target, for example by providing threaded openings into the target configured to receive the corresponding bolt. The depicted bolt attachments are exemplary and can be alternative fasteners such as pins or other structures which pass through the backing plate and into target. In alternative embodiments the fasteners can pass through the target.

Deflectors 42a are not limited to a particular height and can preferably be provided to extend an entirety of the distance between backing plate 14 to a backside surface of an interfacing target. However, the invention also contemplates embodiments where one or more of deflectors 42a or portions thereof, extend less than an entirety of the distance to an interfacing target surface.

For target assemblies in accordance with the invention, it can be preferable to provide a strong target material since the target can be mechanically attached to the backing plate at a relatively few points of attachment compared to prior art attachment techniques (such as bonding). The use of high strength target materials can allow minimization of assembly components to the target and the backing plate. In contrast, conventional assemblies utilizing relatively low strength materials often utilize a first backing plate attached to the target and a second backing plate attached to the first backing plate with cooling channels being disposed between the first and second backing plates. The absence of an intermediate backing plate in the assemblies of the invention can allow the target to be thicker thereby providing a greater amount of material available for sputtering and a longer target life.

To achieve high strength targets for use in assemblies in accordance with one aspect of the invention, methods such as equal channel angular extrusion (ECAE) or other severe plastic deformation techniques can be utilized to enhance or maximize material strength, especially for relatively soft materials such as aluminum and aluminum alloys. Where high-strength materials are utilized, it can be preferable to configure the assembly for minimal attachment such as at the center and edge only to minimize any potential disadvantage of disruption of water flow by intermediate radial attachments such as through deflector structures.

Turning next to FIG. 7, such depicts a backing plate 14 having a plurality of contoured deflectors 42b of similar contour to those depicted in FIG. 6. Deflectors 42b are illustrated to be thinner than those previously depicted and can be utilized in alternative embodiments where bolts will not be provided to pass through the deflectors. In particular instances, projections 52a-52e can be provided at particular locations extending above deflectors 42b with such projection being more clearly visible in the cross-sectional view shown in FIG. 8. Projection portions 52a through 52e can be referred to as "keys" and can be provided in a specific pattern which is a mirror image of a pattern of openings present on an interfacing target surface (see FIG. 9). The number of intermediate keys 52 can vary and placement of such inner radial keys along the various deflectors can additionally vary.

As shown in FIG. 7 and FIG. 8, backing plate 14 can optionally comprise a central key 54 having a head portion 57 which extends above the height of deflectors 42b. It is to be understood that the invention additionally contemplates utilization of central key 54 and radial keys 52a-52e independently of one another.

Referring to FIG. 8, such depicts backing plate 14 in cross-sectional view taken along line 8-8 of FIG. 7. As illustrated, peripheral region 30 surrounds a depression or cavity 33 within front side 32 of the backing plate. Deflectors 42b are depicted as spanning the distance between the floor of cavity 33 and an uppermost elevation of front side 32. Intermediate keys 52b are shown to extend above the uppermost surface. Central key 54 can comprise a stem portion 55 which extends from the cavity floor to an uppermost surface of the backing plate. Central key 54 can additionally comprise one or more extension portions which extend laterally beyond the width of the stem thereby forming head portion 57. Referring again to FIG. 7, these extensions can be laterally opposed as illustrated. However, the invention contemplates utilization of alternative key shapes relative to that depicted in the figures. Although the figures depict intermediate keys 52 as extending radially inward from the associated deflector, keys 52 can extend outward from the deflector, can have alternative shapes, and/or can extend radially inward and radially outward from the deflector.

Referring to FIG. 9, such depicts a target 16 in accordance with the invention which can be utilized in association with backing plate 14 depicted in FIG. 7. As illustrated, target 16 can comprise a peripheral region 60 which can have a plurality of bolt openings 61 passing therethrough. Such bolt openings can be provided to align with corresponding openings 31 on backing plate 14 (FIG. 7).

Target 16 has a surface 58 which opposes a sputtering surface 59 (more clearly visible in FIG. 10). As shown in FIGS. 9-10, surface 58 can be configured to have a pattern of intermediate openings 62a-62e which mirror image the pattern of keys 52a on backing plate 14 shown in FIG. 7. Target 16 can additionally comprise a channel 64 encircling an inner radius of target 16 and interconnecting openings 62a-62e. Referring to FIG. 10, such further illustrates channel 64 and shows an extension 63 beneath surface 58, with extension 63 extending radially inward relative to the surface opening portion of channel 64.

Target 16 has a central opening 66 which has a shape mirroring the shape of central key 54 on backing plate 14 (FIG. 7). It is noted with reference to FIG. 9 that target 16 is rotated 90° relative to the backing plate 14 shown in FIG. 7. Referring to FIG. 10, such depicts extensions 67 of opening 66 which extend bi-directionally and laterally from a central portion of opening 66 beneath surface 58.

As illustrated in FIG. 9, channel 64 and the extension portion 67 of opening 66 can completely encircle a portion of the target. Alternatively, channel 64 or portions thereof can extend only partially from an opening 62 toward the next adjacent opening. Similarly, extension portion 67 of central opening 66 can form a circular path around the center point on the target as shown, or can alternatively extend less than an entirety of a central circular region beneath surface 58.

In an alternative configuration, a target rather than the backing plate can comprise deflectors having projections in accordance with the invention. For example the deflectors and keys associated with the backing plate as illustrated in FIGS. 7-8 can replace the deflectors of the target shown in FIG. 5. A backing plate configured to interface such target can have the corresponding pattern of openings illustrated in association with the target of FIG. 9. The invention further contemplates targets having any of the alternative key patterns discussed herein, and backing plates having the corresponding pattern of openings configured to receive the keys.

Figure 11:
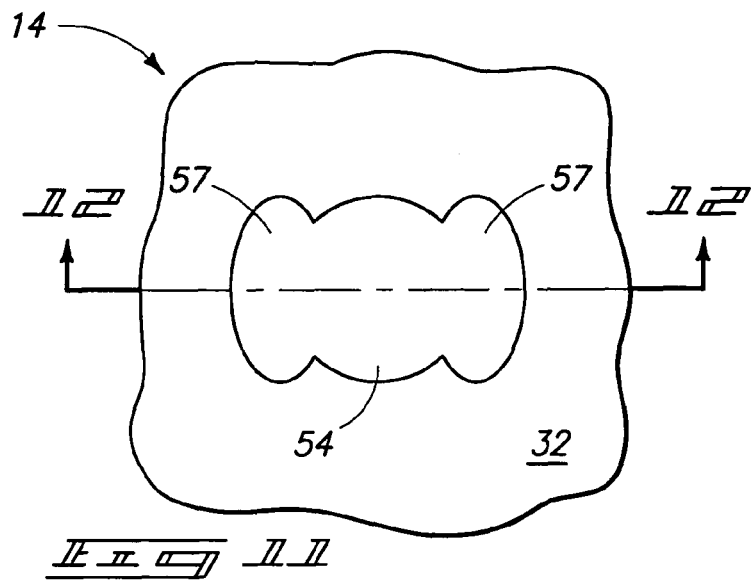
FIG. 11 is an enlarged fragmentary view of a portion of the backing plate depicted in FIG. 7.
Figure 12:
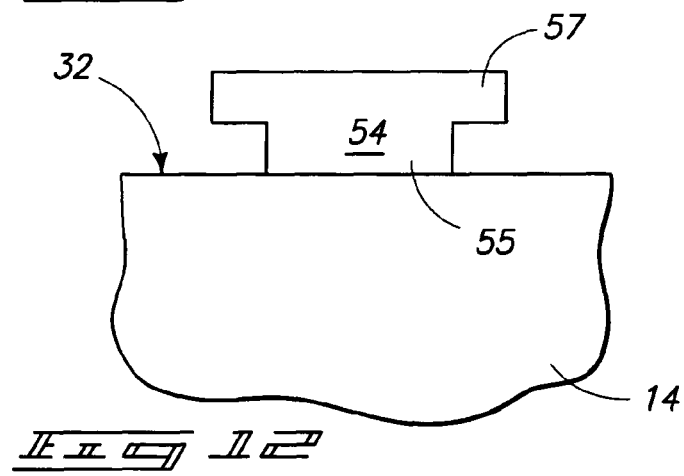
FIG. 12 is an enlarged fragmentary cross-sectional view of a portion of the backing plate depicted in FIG. 8, taken along line 12-12 of FIG. 11.
Figure 13:
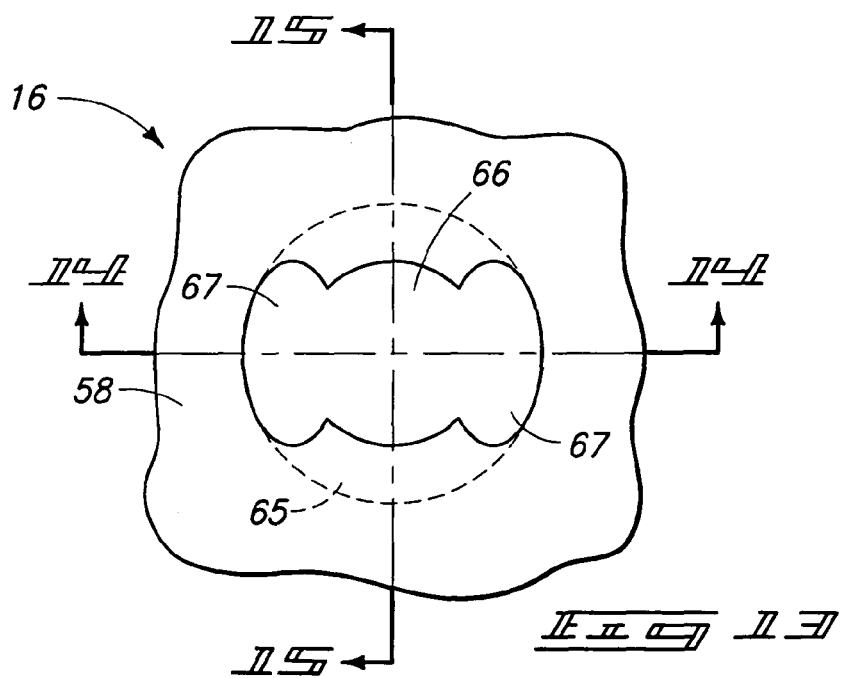
FIG. 13 is an enlarged fragmentary top view of a portion of the target shown in FIG. 9.

FIGS. 11-15 illustrate various aspects of the key attachment configuration for target assemblies in accordance with the invention. As shown in FIG. 11, central key 54 can have two opposing lateral extensions 57. It is to be understood that the shape of these extensions can vary and that such extensions need not be directly laterally opposed. Preferably, key 54 is provided to have a shape which mirrors an opening in the target to be associated with such backing plate. An exemplary mirror image opening within a target is depicted in FIG. 13. Referring to FIG. 12, such shows extensions 57 projecting laterally outward and elevationally above stem portion 55. When backing plate 14 is inverted such that front side 32 will interface target (FIG. 13), key portion 54 can be aligned with and fit into opening 66 within the target. Such mating of the backing plate to the target can be followed by rotation of the target and backing plate relative to one another such that projection portions 57 rotate within channel extension regions 55 to slide beneath surface 58 thereby mechanically engaging the target and backing plate.

Figure 14:
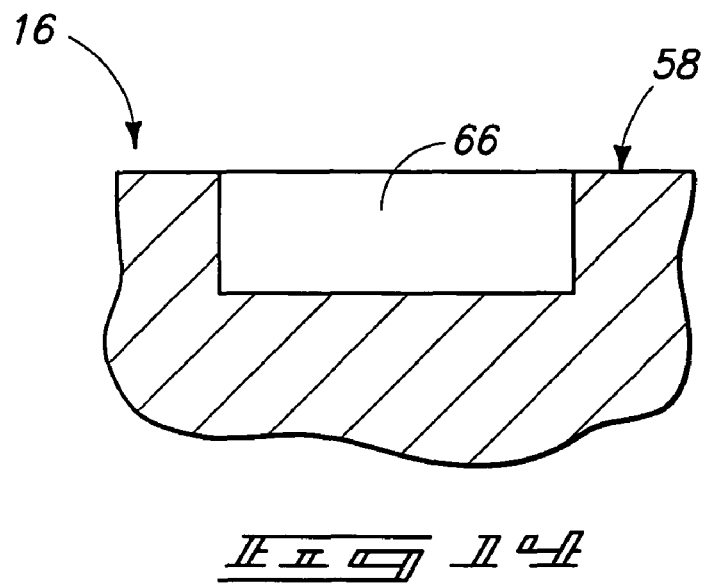
FIG. 14 is a diagrammatic cross-sectional view taken along line 14-14 of FIG. 13.
Figure 15:
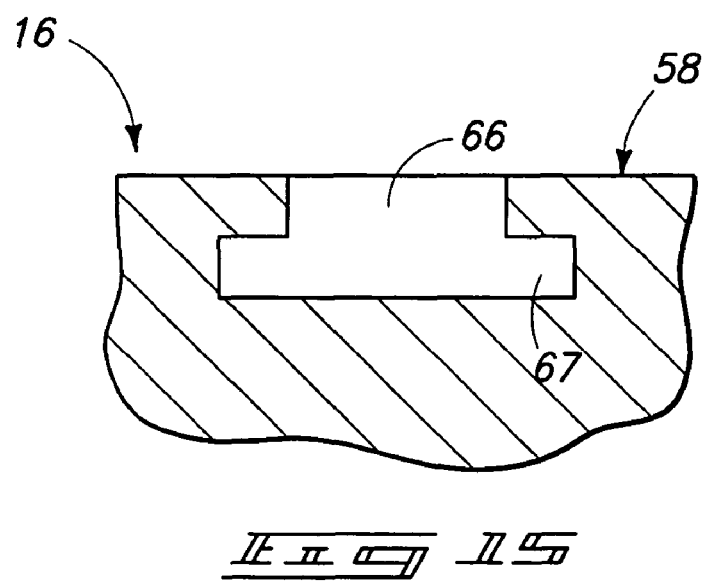
FIG. 15 is a diagrammatic cross-sectional view taken along line 15-15 of FIG. 13.

As shown in FIG. 14, opening 66 is configured in one direction to receive a matching key and, as depicted in FIG. 15, upon rotation of the key within the opening can retain the key to lock the backing plate onto the target.

Referring again to FIGS. 7-10, the pattern of intermediate keys 52a-52e mirrors the pattern of openings 62a-62e in the target such that upon insertion of central key 54 each of intermediate keys 52 becomes inserted within a corresponding opening 62 of the target. Rotation of the target relative to the backing plate slides projections 52a beneath surface 58 of the target for additional lock strength between the target and backing plate.

Figure 16:
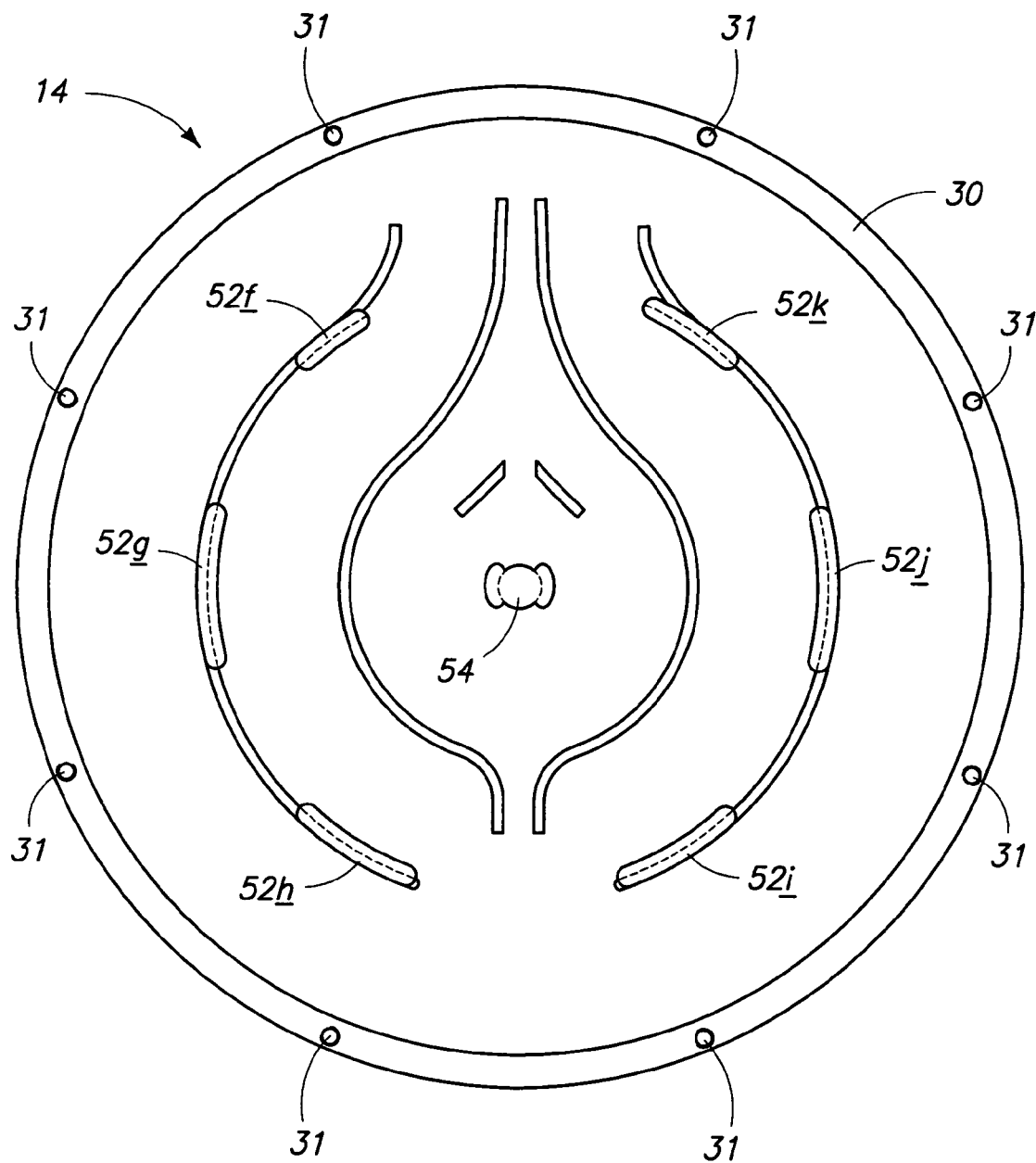
FIG. 16 is a diagrammatic top view of an alternative backing plate configuration relative to that shown in FIG. 7.
Figure 17:
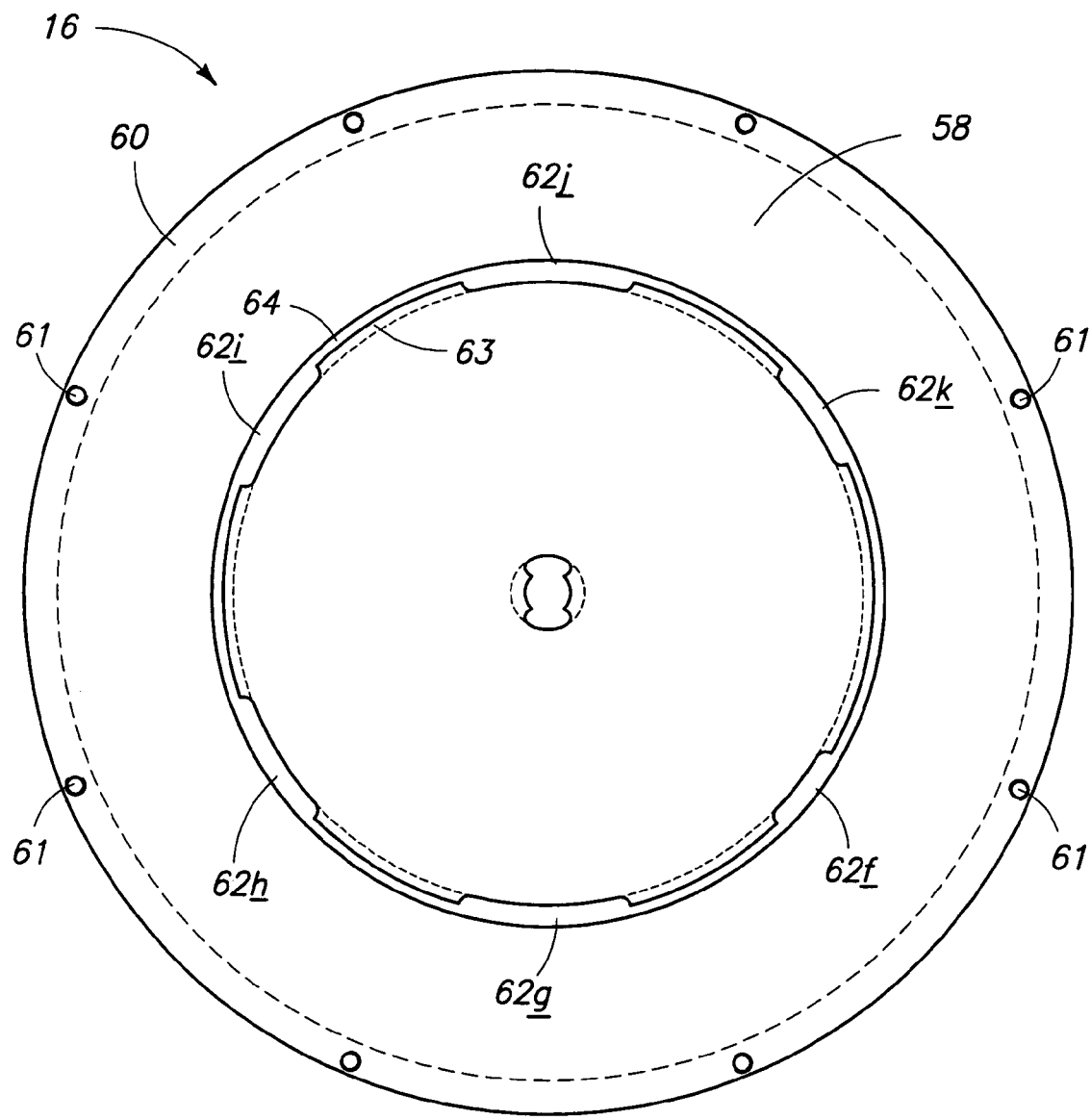
FIG. 17 is a diagrammatic top view of an alternative sputtering target configuration relative to that shown in FIG. 9.

The number, size and positioning of intermediate keys is not limited to the pattern depicted on the backing plate and target shown in FIGS. 7-10. An exemplary alternative key pattern is illustrated in FIGS. 16-17. Referring to FIG. 16, such illustrates backing plate 14 having intermediate keys 52f-52k. It is noted that the keys present are not all of an equivalent size. A complementary target is shown in FIG. 17 which has an appropriate pattern of openings 62f-62k for receiving the keys of the backing plate. It can be preferable to provide a key pattern such that the keys of the backing plate can be inserted into the openings in the target only upon a particular alignment. Such patterning can provide ease of proper alignment between the target and backing plate.

It is to be understood that the invention contemplates key patterns utilizing fewer or greater numbers of intermediate keys relative to the five key and six key patterns shown. Placement of the keys along a given deflector can also vary, and keys can be provided on a fewer or more deflectors than the patterns having two keyed-deflectors illustrated in the drawings.

Although the target and backing plate structures shown in FIGS. 7-17 are shown and described as having both central key and inter-radial keys, it is to be understood that these features can be used independently of one another. Additionally, one or more of these features can be replaced by a bolt attachment configuration such as described above. Additionally, peripheral bolts can be utilized as depicted or alternatively can be omitted or can be replaced by inserts or other attachment or bonding techniques between the target and the backing plate in the peripheral region. Utilization of key configurations in accordance with the invention can minimize or prevent water leakage that can result from vacuum application utilizing assemblies which have bolt openings or other openings which pass through the target, through the backing plate, or both. The assemblies in accordance with the invention can allow water or other coolant to flow between target and backing plate under relatively low coolant pressure and without the use of an additional part (i.e. channeled insert).

The configuration of the inventions where key projections are utilized also allow the target and backing plate to rotate relative to one another for adjustment of alignment. Accordingly, assemblies comprising these configurations can be aligned and assembled more easily than conventional assemblies.

The target materials and backing plate materials available and used in conventional target assemblies such as those discussed in the background section, as well as those yet to be developed, can be utilized in assemblies of the invention. In particular applications, aluminum alloy backing plates can be preferred to provide material strength.

Due to limited or minimized mechanical attachment sites between the target and the backing plate in assemblies in accordance with the invention, use of strong target material such as ECAE treated materials can be preferred. ECAE materials can also be utilized for backing plates in accordance with the invention. In particular instances it can be preferable to minimize the number of radial keys used to minimize potential disadvantage of disruption of water flow. However, the use of a central key can effectively limit central warpage, and additional intermediate keys can provide further stability and decreased target warpage.

Methods of target cooling in accordance with the invention can utilize any of the targets and/or backing plates described above. A target and a backing plate can be provided and can be incorporated into a target assembly. In particular aspects, where one or both of the target and the backing plate have coolant deflectors, the deflectors are present within a gap formed between the associated target and backing plate of the assembly. Coolant is flowed within the gap to cool the target. As described above, the deflectors in accordance with the invention can deflect at least a portion of the coolant in a nonlinear path between a coolant inlet to an outlet through the gap.

Target assemblies in accordance with the invention were subjected to pressure testing and cooling studies. Pressure testing was performed utilizing two types of pressure test. Open system testing was performed utilizing a maximum flow rate available with water flowing freely through the entire system. For the open system testing deflection, pressure (at the pressure gage), leakage and flow rate at the exit of the system were monitored.

The results of open system testing utilizing a target assembly having both central and mid-radius keys are presented in Table 1. The results indicted that in the open system no leakage occurred. Neither target deflection nor backing plate deflection was detected.

TABLE 1

Open System Pressure Test

| Initial flow rate (at source) | Exit flow rate | Pressure (at gage) | Deflection of backing plate | Deflection of target | Leakage |
|---|---|---|---|---|---|
| 5.62 gal/min (21.35 L/min) | N/A | 5 psi | 0 mm | 0 mm | none |
| 12.48 gal/min (48 L/min) | 7.995 gal/min (30.75 L/min) | 11 psi | 0 mm | 0. mm | none |

Closed system testing was also performed on the same target assembly (with central and mid-radius keys). The closed system testing utilized controlled pressure by initiating water flow and gradually opening the regulator to a specific predetermined pressure. Upon achieving the specified pressure, the flow was adjusted to maintain constant pressure. During the closed system testing, deflection, pressure at the pressure gage, leakage, and flow rate at the exit of the system were monitored. The results of the closed system study performed on the central and mid-radius key assembly are presented in Table 2. The results indicate a lack of detectable target deflection and zero to minimal target backing plate deflection along line A and line B (where line A refers to a straight line extending between the inlet and the outlet across the backing plate, and where line B extends centrally across the backing plate surface perpendicular to line A). No leaks occurred for any of the tested pressures.

TABLE 2

Closed System Test

| Pressure (read at gage) | Time at constant pressure | Target deflection | Backing plate deflection (LINE A) | Backing Plate Deflection (LINE B) | Leakage |
|---|---|---|---|---|---|
| 5 psi | 5 min | 0 mm | 0 mm | 0 mm | none |
| 10 psi | 5 min | 0 mm | 0 mm | 0 mm | none |
| 15 psi | 5 min | 0 mm | 0 mm | 0 mm | none |
| 20 psi | 24 hr | 0 mm | 0.25 mm | 0 mm | none |
| 25 psi | 24 hr | 0 mm | 0.5 mm | 0 mm | none |
| 30 psi | 4 hr | 0 mm | 0.75 mm | 0.25 mm | none |
| 35 psi | 72 hr | 0 mm | 0.9 mm | 0.25 mm | none |

Analogous closed system and open system testing was conducted for target assemblies having central bolts (utilizing aluminum alloy Al2024 T351), or a central key (utilizing backing plates of aluminum alloy 6061 T4). The results of such study are presented in FIG. 18 along with open and closed system testing of an assembly having backing plate with central and mid-radius bolts. An area of estimated preferred range of operating pressure and water flow (based on modeling and experiments) is encircled on the FIG. 18 graph.

The results presented in FIG. 18 reveal that assemblies utilizing backing plates having central and mid-radius bolts showed no deflection of the backing plate throughout and beyond the encircled preferred range of operating pressure and water flow. Conditions for the open system testing presented in FIG. 18 included flow rate of 8-9 gallons per minute at a pressure of 10-15 psi. Closed system conditions were performed at pressures up to 35 psi. Under the closed system deflection remained at less than 1 mm even along line A which has the least amount of bolt support. No leakage was observed for the assembly having central and mid-radius bolts even after several severe pressure tests at 35 psi pressure for 72 hours.

Comparison of target cooling efficiency for assemblies of the invention relative to conventional high-pressure cooling was performed. FIG. 19 shows the cooling profile for a conventional target (top) cooled utilizing high-pressure (80-100 psi) and a target cooling profile for a target assembly of the invention (bottom) cooled utilizing low pressure (approximately 10 psi). The study indicates that the assemblies of the invention can provide sufficient cooling efficiency to allow low pressure to be utilized. In general, assemblies of the invention can typically afford sufficient cooling at pressures of from 10-20 psi although higher pressures are contemplated. This low pressure operation range affords decreased target warpage relative to the higher pressures utilized conventionally.

Target assembly configurations of the invention which have the ability to operate using low-pressure cooling allows target assembly can be more cost efficient than conventional assemblies since manufacturing costs are reduced. The assemblies of the invention utilize fewer parts (absence of cooling plate) to achieve the desired cooling effects and are therefore easier to manufacture as well. Joining and alignment of targets and backing plates of the invention is also simplified relative to conventional assemblies due to the use of mechanical fasteners which can eliminate the two bonding steps typically utilized for conventional assembly, and allow alignment by rotation (discussed above). This mechanical attachment can additionally provide stronger attachment than conventional bonding methodology. Additionally, use of high strength materials such as ECAE materials can further reduce warpage and can allow targets to be sputtered deeper into the target material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A target backing plate comprising:
a first side configured to interface with a sputtering target;
a second side opposing the first side; and
a plurality of deflectors disposed on and integral with the first side, at least a portion of each of the deflectors being non-linear, wherein the first side further comprises a coolant inlet and a coolant outlet, wherein the plurality of deflectors forms a plurality of coolant channels, and wherein coolant is deflected from a linear flowpath over at least a portion of a distance between the coolant inlet and the coolant outlet, and wherein there are a plurality of elongated portions present at the ends of the plurality of deflectors proximate to the coolant inlet.

2. The target backing plate of claim 1 wherein the plurality of deflectors comprise a first set of deflectors and a second set of deflectors, the first and second sets being mirror images of each other across a line of symmetry.

3. The target backing plate of claim 1 wherein some of the deflectors comprised by the plurality of deflectors comprise an arced segment, wherein arced segments from the at least some of the deflectors are concentric.

4. The target backing plate of claim 1 wherein at least some of the deflectors comprised by the plurality of deflectors comprise a first arced segment arched in a first direction and a second arced segment arched in a second direction opposing the first direction.

5. A sputtering target assembly comprising:
a sputtering target;
a backing plate; and
a plurality of coolant deflectors disposed between the target and the backing plate and spanning a gap between the target and the backing plate, at least a segment of each of the deflectors being non-linear, wherein the coolant deflectors form a plurality of coolant channels, and wherein there are a plurality of elongated portions present at the ends of the plurality of deflectors proximate to a coolant inlet.

6. The sputtering target assembly of claim 5 wherein the plurality of deflectors comprises a first set of deflectors and a second set of deflectors, wherein the first and second set are disposed across a line of symmetry.

7. The sputtering target assembly of claim 5 wherein at least some of the deflectors comprise an arced segment.

8. The sputtering target assembly of claim 5 wherein the deflectors are integral with the target.

9. The sputtering target assembly of claim 5 wherein the deflectors are integral with the backing plate.

10. The sputtering target assembly of claim 5 wherein a central bolt extends through a center of the target and a center of the backing plate.

11. The sputtering target assembly of claim 5 wherein at least one of the target and the backing plate comprises a material processed utilizing equal channel angular extrusion.

12. A method of cooling a target comprising:
providing a target;
providing a backing plate associated with the target;
providing coolant deflectors spanning a gap between the target and the backing plate, the coolant deflectors being non-linear along at least a portion of their length, wherein the coolant deflectors form a plurality of coolant channels; and
flowing a coolant in a linear flowpath within the gap between the target and the backing plate, wherein there are a plurality of elongated portions present at the ends of the coolant deflectors proximate to a coolant inlet.

13. The method of claim 12 wherein the deflectors comprise concentric arched segments.

14. The method of claim 12 wherein the assembly comprises a coolant inlet on a first radial side of the assembly, and a coolant outlet disposed radially opposing the inlet, and wherein the deflectors deflect at least a portion of the coolant in a non-linear flowpath through the gap from the inlet to the outlet.

15. The method of claim 12 wherein at least some of the deflectors span the depth of the gap.

16. The method of claim 12 wherein at least some of the deflectors are integral with the backing plate.

17. The method of claim 12 wherein at least some of the deflectors are integral with the sputtering target.

18. The method of claim 12 wherein the target is joined to the backing plate utilizing at least one projection which projects from the backing plate and is inserted into an opening within the target, wherein the opening extends only partially through the target.

* * * * *